(12) United States Patent
Kawano et al.

(10) Patent No.: US 8,763,242 B2
(45) Date of Patent: Jul. 1, 2014

(54) SEMICONDUCTOR DEVICE AND METHOD OF MANUFACTURING THE SAME

(75) Inventors: Kenya Kawano, Hitachinaka (JP); Chiko Yorita, Fujisawa (JP); Yuji Shirai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 538 days.

(21) Appl. No.: 12/956,224

(22) Filed: Nov. 30, 2010

(65) Prior Publication Data

US 2011/0128713 A1 Jun. 2, 2011

(30) Foreign Application Priority Data

Nov. 30, 2009 (JP) ................... 2009-271258

(51) Int. Cl.
 *H05K 3/30* (2006.01)
 *H05K 3/00* (2006.01)
 *H05K 3/36* (2006.01)
 *H01K 3/22* (2006.01)

(52) U.S. Cl.
 USPC .............. 29/841; 29/829; 29/830; 29/852

(58) Field of Classification Search
 USPC ............... 29/829, 830, 841, 852; 174/250; 438/622, 637; 156/349
 See application file for complete search history.

(56) References Cited

U.S. PATENT DOCUMENTS

| | | | | |
|---|---|---|---|---|
| 5,387,888 A | * | 2/1995 | Eda et al. | 333/247 |
| 5,745,333 A | * | 4/1998 | Frankeny et al. | 361/313 |
| 6,005,197 A | * | 12/1999 | Kola et al. | 174/260 |
| 6,218,729 B1 | * | 4/2001 | Zavrel et al. | 257/698 |
| 6,274,224 B1 | * | 8/2001 | O'Bryan et al. | 428/209 |
| 6,512,182 B2 | * | 1/2003 | Takeuchi et al. | 174/256 |
| 6,677,630 B1 | * | 1/2004 | Kanaya et al. | 257/295 |
| 6,822,170 B2 | * | 11/2004 | Takeuchi et al. | 174/258 |
| 6,910,266 B2 | * | 6/2005 | Lee et al. | 29/832 |
| 6,952,049 B1 | * | 10/2005 | Ogawa et al. | 257/700 |
| 7,856,710 B2 | * | 12/2010 | Kariya et al. | 29/852 |
| 2001/0026444 A1 | * | 10/2001 | Matsushima et al. | 361/763 |
| 2003/0015348 A1 | * | 1/2003 | Lee et al. | 174/260 |
| 2003/0085058 A1 | * | 5/2003 | Komatsu et al. | 174/264 |
| 2003/0215619 A1 | * | 11/2003 | Ooi et al. | 428/209 |
| 2004/0108134 A1 | * | 6/2004 | Borland et al. | 174/260 |
| 2004/0231885 A1 | * | 11/2004 | Borland et al. | 174/260 |

(Continued)

FOREIGN PATENT DOCUMENTS

| | | |
|---|---|---|
| JP | 2003-163232 A | 6/2003 |
| JP | 2008-153492 A | 7/2008 |
| JP | 2008-166327 A | 7/2008 |

*Primary Examiner* — David Angwin
(74) *Attorney, Agent, or Firm* — Mattingly & Malur, PC

(57) ABSTRACT

In a method of manufacturing a semiconductor device, a second wiring substrate is stacked over a first wiring substrate using a conductive paste, where each wiring substrate has mounted thereon an electronic component. The conductive paste is hardened to form a metal column which forms an electrical connection between the first wiring substrate and the second wiring substrate. The wiring substrates are sealed with a resin. The semiconductor device can be downsized, thinned, and made highly reliable, and its manufacturing cost can be reduced. By using conductive paste for the electrical connection between the wiring substrates, a connecting pitch can be smaller than that in a connecting method of using a solder ball including Cu core, and a connection at low temperature can be achieved. Also, by coating the conductive paste by a print-coating or dispense-coating method, manufacturing is simplified and the manufacturing cost is reduced.

7 Claims, 5 Drawing Sheets

(56) References Cited

U.S. PATENT DOCUMENTS

| | | |
|---|---|---|
| 2005/0155792 A1* | 7/2005 | Ito et al. .................. 174/264 |
| 2006/0029726 A1* | 2/2006 | Mok et al. .................. 427/96.1 |
| 2008/0022520 A1* | 1/2008 | Egitto et al. .................. 29/830 |
| 2008/0104833 A1* | 5/2008 | Kariya et al. .................. 29/852 |
| 2008/0155820 A1* | 7/2008 | Arai et al. .................. 29/830 |
| 2008/0174978 A1* | 7/2008 | Inoue et al. .................. 361/784 |
| 2010/0147576 A1* | 6/2010 | Hondo .................. 174/266 |
| 2011/0289774 A1* | 12/2011 | Kumar et al. .................. 29/852 |
| 2012/0017437 A1* | 1/2012 | Das et al. .................. 29/852 |

* cited by examiner

US 8,763,242 B2

SEMICONDUCTOR DEVICE AND METHOD OF MANUFACTURING THE SAME

CROSS-REFERENCE TO RELATED APPLICATION

The present application claims priority from Japanese Patent Application No. 2009-271258 filed on Nov. 30, 2009, the content of which is hereby incorporated by reference into this application.

TECHNICAL FIELD OF THE INVENTION

The present invention relates to a semiconductor device and a method of manufacturing the same. More particularly, the present invention relates to a technique effectively applied to a semiconductor device and a method of manufacturing the same having a three-dimensional mounting structure in which a plurality of wiring substrates each mounting an electronic component are stacked.

BACKGROUND OF THE INVENTION

As high performance of an electronic component has been advanced in recent years, a semiconductor device on which the electronic component is highly integrated has been developed. As such a semiconductor device, for example, an electronic-component embedded substrate which is three-dimensionally mounted is known, in which the electronic component is mounted on a wiring substrate, another wiring substrate is stacked on the wiring substrate, and they are sealed by a resin, as described in Japanese Patent Application Laid-Open Publication No. 2008-153492 (Patent Document 1).

As illustrated in FIG. 11, in an electronic-component embedded substrate 48 described in Patent Document 1, an electronic component 30 is mounted on an upper surface of a lower-layer side wiring substrate 10 between two substrates of the lower-layer side wiring substrate 10 and an upper-layer side wiring substrate 20, and the lower-layer side wiring substrate 10 being a first wiring substrate and the upper-layer side wiring substrate 20 being a second wiring substrate are electrically connected with each other by solder balls 40. Also, a sealing resin 45 is injected between the lower-layer side wiring substrate 10 and the upper-layer side wiring substrate 20 so as to cover the electronic component 30. A bonding pad 12 formed on the lower-layer side wiring substrate 10 and an electrode 32 formed on the electronic component are electrically connected with each other by a bonding wire 46, and a resin 47 is coated on a bonding portion between the electrode 32 and the bonding wire 46.

Further, bumps 14 each made of solder or others are bonded on a lower surface of the lower-layer side wiring substrate 10. On the other hand, circuit components 16 such as a capacitor, a resistor, and an inductor and the electronic component 30 are mounted on the upper surface of the lower-layer side wiring substrate 10. Note that wirings and electrodes formed on an upper surface and a rear surface of each of the lower-layer side wiring substrate 10 and the upper-layer side wiring substrate 20 in FIG. 11 are not illustrated.

Still further, FIG. 12 is a plan view partially illustrating the electronic-component embedded substrate 48 illustrated in FIG. 11. Note that, in order to easily understand the structure in FIG. 12, only the lower-layer side wiring substrate 10, the electronic component 30 arranged on the upper surface of the lower-layer side wiring substrate 10, the circuit components 16, and the solder balls 40 are illustrated. And, the upper-layer side wiring substrate 20, the sealing resin 45, the bonding wire 46, the resin 47, and wirings on the upper surface of the lower-layer side wiring substrate 10 are not illustrated.

In the electronic-component embedded substrate 48, as illustrated in FIG. 11, wiring electrodes (not illustrated) formed on respective surfaces of the lower-layer side wiring substrate 10 and the upper-layer side wiring substrate 20 are electrically connected with each other by the solder ball 40. The solder ball 40 is formed by coating an outer surface of a Cu core 42 made of Cu (copper) in a spherical shape by solder 44. The solder ball 40 including the Cu core 42 has a function of a spacer between the lower-layer side wiring substrate 10 and the upper-layer side wiring substrate 20 so that the electronic component 30 mounted on the lower-layer side wiring substrate 10 does not contact the upper-layer side wiring substrate 20. Therefore, it is required that a diameter of the solder ball 40 is larger than a height from the upper surface of the lower-layer side wiring substrate 10 to an upper surface of the electronic component 30 when the electronic component 30 is mounted.

Such a structure that, the plurality of wiring substrates each mounting the electronic component are stacked, the wiring of each wiring substrate is electrically connected with the other, and the entire of them is sealed by the resin, is generally called "PoP (package on package)" because another package is stacked on a package. The package in which the electronic component is highly integrated by the PoP structure is used for a semiconductor device for communication which mounts a plurality of electronic components such as a high-frequency power amplifier, a surface acoustic wave filter, or an antenna switch, or a semiconductor device called "SiP (system in package)" which mounts a plurality of DRAMs (dynamic random access memory) or microcomputers. Also, the semiconductor device is used in mobile equipment such as a mobile phone and a digital still camera, and a consumer product such as a digital television and a laser beam printer.

SUMMARY OF THE INVENTION

However, in the electronic-component embedded substrate 48 described in Patent Document 1 and illustrated in FIG. 11, when the solder ball 40 including the Cu core 42 is used for the electrical connection between the lower-layer side wiring substrate 10 and the upper-layer side wiring substrate 20, a connecting pitch L2 of the solder ball 40 is necessarily large, and therefore, there arise a problem that it is difficult to downsize the semiconductor device. Note that the connecting pitch L2 described here is a distance from a center of one solder ball 40 to a center of the other solder ball 40 adjacent to the one solder ball in the same wiring substrate.

More specifically, when a thickness of the electronic component 30 is 400 μm, at least 400 μm or larger is required for a diameter L1 of the solder ball 40 including the Cu core 42 having the spacer function, and 400 μm or larger is required for the connecting pitch L2 as well. At this time, if the diameter L1 of the solder ball 40 and the connecting pitch L2 have the same value, the adjacent solder balls 40 contact each other, and therefore, a distance larger than 400 μm is required for the connecting pitch L2, and the downsizing of the semiconductor device is significantly prevented.

Note that the solder 44 on the outer surface of the solder ball 40 is melted by a heating process in the adhesion between the lower-layer side wiring substrate 10 and the upper-layer side wiring substrate 20, and therefore, a height of the solder ball 40 is lowered as much as the solder 44 is melted. Therefore, in order not to contact a base surface of the upper-layer side wiring substrate 20 with the electronic component 30 or the bonding wire 46 connected with the electronic component 30 by the spacer function of the solder ball 44, it is required that a diameter of the Cu core 42 itself is larger than heights of the electronic component 30, the bonding wire 46, and the resin 37.

Also, a melting point of the solder 44 such as a ternary-alloy solder made of Sn (tin), Ag (silver), and Cu is about 220° C., and therefore, it is required to set a temperature in reflow heating for the connection of the solder ball 40 to about 245° C. However, thermal deformation of the wiring substrate is increased by the reflow heating for a downsized and thinned semiconductor device, and there is a possibility that reliability of the semiconductor device is significantly decreased. The wiring substrate is significantly influenced by heat easier as a thickness of the wiring substrate is thinner, and therefore, it is disadvantageous to use the solder ball 40 for the connection between the stacked substrates for achieving the downsizing of the semiconductor device and manufacturing cost reduction thereof.

Further, a manufacturing cost of the solder ball 40 including the Cu core 42 is high and a dedicated assembly device for arranging the solder ball 40 on the wiring substrate is required, and therefore, it is disadvantageous for manufacturing the semiconductor device with a low cost in many cases.

Still further, when a wiring substrate such as a printed board mounting a downsized and thinned electronic component is heated at the melting point of solder or higher, there is a possibility that the wiring substrate is burned and a metal wire is burned and cut to prevent their functions.

Therefore, in the semiconductor device using the solder ball 40 including the Cu core 42 for the electrical connection between the lower-layer side wiring substrate 10 and the upper-layer side wiring substrate 20, it is extremely difficult to achieve a downsized, thinned, high-reliable, and low-cost semiconductor device.

A preferred aim of the present invention is, in a semiconductor device in which wiring substrates are stacked and sealed by a resin, to achieve a downsized and thinned semiconductor device and provide a high-reliable and low-cost semiconductor device.

The above and other preferred aims and novel characteristics of the present invention will be apparent from the description of the present specification and the accompanying drawings.

The typical one of the inventions disclosed in the present application will be briefly described as follows.

In a semiconductor device according to an embodiment of the present invention, an electronic component is mounted between at least two wiring substrates, at least one wiring substrate of the two wiring substrates is electrically connected with the electronic component, the two wiring substrates are electrically connected with each other, the two wiring substrates including the electronic component are sealed by a resin, and a conductive material is used for the electrical connection between the two wiring substrates.

The conductive material contains a plurality of metal particles, and each surface of the plurality of metal particles is partially adhered with the other.

Another typical one of the inventions disclosed in the present application will be briefly described as follows.

A plurality of substrates each mounting an electronic component are stacked, and the substrates are electrically connected with each other, so that a semiconductor device can be downsized and thinned.

Also, thermal deformation of a wiring substrate used in the semiconductor device is suppressed, so that decrease in reliability of the semiconductor device can be prevented.

Further, a manufacturing cost of the semiconductor device can be reduced, so that a cheap semiconductor device can be provided.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1:
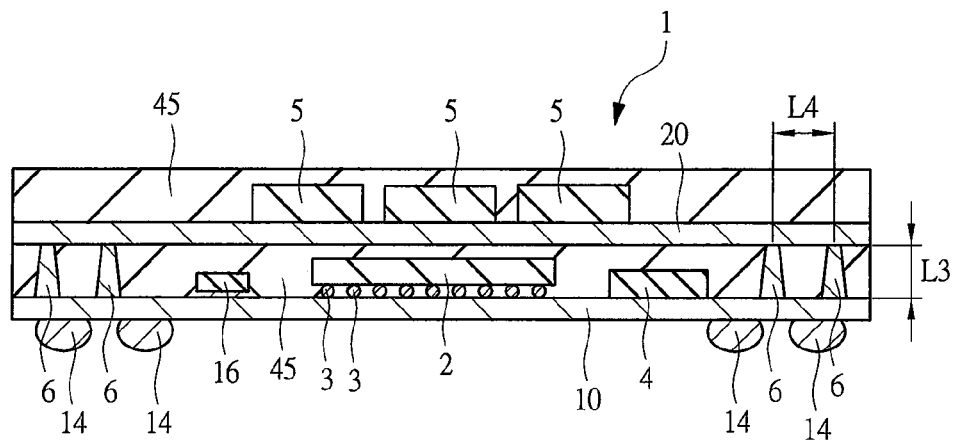
FIG. 1 is a cross-sectional view of a principal part illustrating a semiconductor device according to an embodiment of the present invention.
Figure 2:
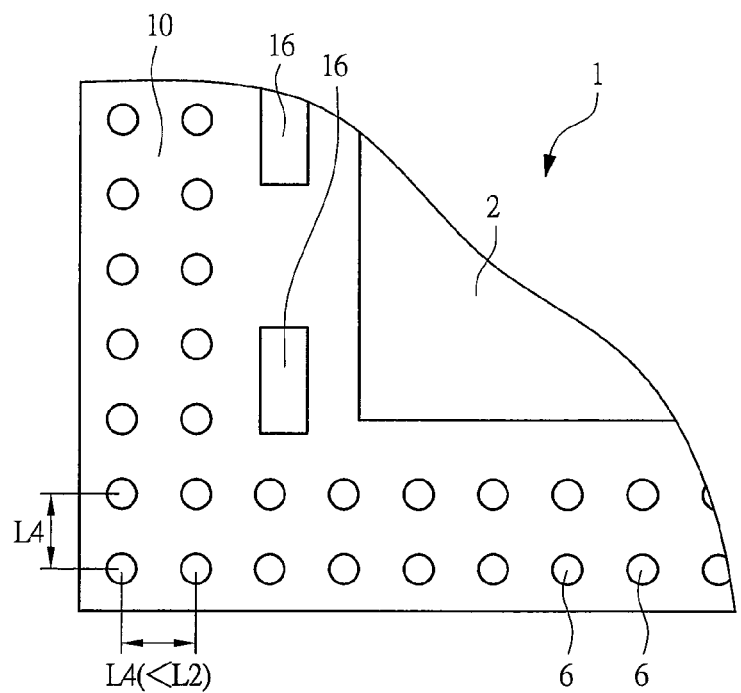
FIG. 2 is a plan view partially illustrating the semiconductor device illustrated in FIG. 1.

FIG. 1 is a cross-sectional view of a principal part of a semiconductor device according to the present embodiment, and FIG. 2 is a plan view partially illustrating the semiconductor device illustrated in FIG. 1. Note that, in order to easily understand the structure in FIG. 2, only the lower-layer side wiring substrate 10, the high-frequency power amplifier chip 2, the circuit component 16, and the solder ball 40 arranged on the upper surface of the lower-layer side wiring substrate 10 are illustrated. And, the upper-layer side wiring substrate 20, the sealing resin 45, the antenna switch 4, and wirings on the upper surface of the lower-layer side wiring substrate 10 are not illustrated.

In the present embodiment, the present invention is described by an example of using the semiconductor device 1 for a high-frequency power amplifier module for communication. That is, a filter 5, an antenna switch 4, and a plurality of circuit devices in addition to a high-frequency power amplifier chip 2 are mounted on the semiconductor device 1.

As illustrated in FIG. 1, the semiconductor device 1 has a structure in which the upper-layer side wiring substrate 20 is stacked on the lower-layer side wiring substrate 10. That is a PoP structure in which a plurality of electronic components are mounted on an upper surface of the lower-layer side wiring substrate 10, and a plurality of electronic components are mounted on an upper surface of the upper-layer side wiring substrate 20 as well. Note that the upper surface of the lower-layer side wiring substrate 10 and a lower surface of the upper-layer side wiring substrate 20 are away from each other by a height "L3".

The high-frequency power amplifier chip 2 which is a semiconductor element is configured with, for example, a laterally diffused-metal oxide semiconductor called LD-MOS, and is electrically connected to the upper surface of the lower-layer side wiring substrate 10 through a flip-chip bump 3 as illustrated in FIG. 1. At this time, as a material of the flip-chip bump 3, ternary-alloy solder made of Sn, Ag, Cu, and others is used. Absolutely, a connection method of using Au (gold) bump or Cu bump instead of the solder may be used.

Also, when a vertical diffusion MOS is used for the high-frequency power amplifier chip 2, a bonding wire (not illustrated) made of Al (aluminum) or Au may be used for the electrical connection between the lower-layer side wiring substrate 10 and an electrode on a front-surface side of the high-frequency power amplifier chip 2, and a conductive connecting material (not illustrated) such as solder, Ag paste, or others may be used for the electrical connection between the lower-layer side wiring substrate 10 and an electrode on a rear(lower)-surface side of the high-frequency power amplifier chip 2.

Circuit components 16 such as an inductor, a resistor, and a capacitor in addition to the high-frequency power amplifier chip 2 are mounted on the upper surface of the lower-layer side wiring substrate 10, and further, for example, a sending/receiving antenna switch 4 is mounted. These electronic components are electrically connected with the lower-layer side wiring substrate 10 through the conductive connecting material such as solder, Ag paste, or others. Also, the number of these mounted electronic components is changed depending on a configuration of electronic equipment in which the electronic components are used. Therefore, in order to simply describe the structure in the present embodiment, only one circuit component 16 and one antenna switch 4 are illustrated as a matter of convenience.

On the lower surface of the lower-layer side wiring substrate 10, a bump 14 made of solder or others is bonded for the external electrical connection.

On the other hand, on the upper surface of the upper-layer side wiring substrate 20, the electronic component such as the filter 5 for removing high-frequency noise is mounted. A surface acoustic wave type filter or a boundary acoustic wave type filter is used for the filter 5, and the filter 5 is electrically connected with the upper-layer side wiring substrate 20 through the conductive connecting material such as solder, Ag paste, or others. The number of the mounted filter 5 is also changed depending on a configuration of electronic equipment in which the filter is used. Therefore, in order to simply describe the structure in the present embodiment, only three filters 5 are illustrated as a matter of convenience.

The sealing resin 45 is filled between the lower-layer side wiring substrate 10 and the upper-layer side wiring substrate 20 so as to cover the electronic component formed on the upper surface of the lower-layer side wiring substrate 10, and the sealing resin 45 is formed on the upper-layer side wiring substrate 20 so as to cover the electronic component such as the filter 5 formed on the upper-layer side wiring substrate 20.

In the semiconductor device 1 according to the present embodiment, an organometallic column 6 is used for the electrical connection between the upper surface of the lower-layer side wiring substrate 10 and the lower surface of the upper-layer side wiring substrate 20.

Figure 6:
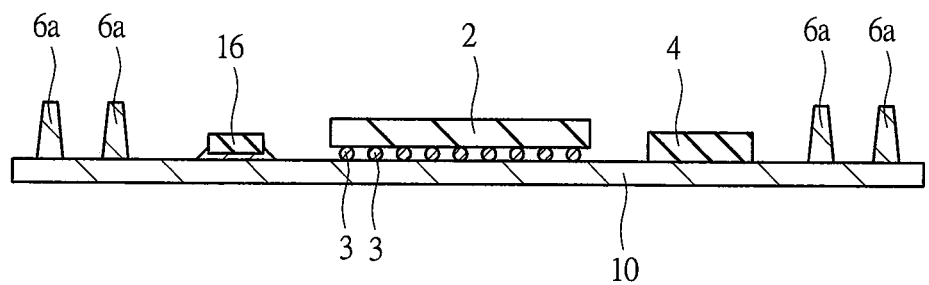
FIG. 6 is a cross-sectional view of the principal part illustrating the method of manufacturing the semiconductor device, continued from FIG. 5.

The organometallic column 6 is formed by sintering an organometallic paste 6a illustrated in FIG. 6, and is made of a conductive material containing aggregate made of metal particles and metal powder. The organometallic paste 6a is a conductive material containing metal particles as a main component and aggregate made of organic dispersant, dispersant supporting agent, volatile organic component (solvent), and metal powder. When the organometallic paste 6a is sintered, the organic dispersant, dispersant supporting agent, and solvent which are volatile organic components are disappeared, and therefore, the organometallic column 6 does not contain the organic dispersant, dispersant supporting agent, and solvent which are the volatile organic components. That is, the organometallic column 6 is formed of aggregate mainly made of metal particles and metal powder, and is hardened different from the organometallic paste 6a having viscosity.

Note that the term of "organometal" described here does not indicate a metal-carbon chemical compound, but indicates a conductive material having metal particles made of Ag, Cu, or others as a main component, to which aggregate made of organic dispersant, dispersant supporting agent, volatile organic component (solvent), and metal powder such as Ag powder or Cu powder is mixed and kneaded.

Here, the metal particles made of Ag, Cu, or others contained in the above-described conductive material are fine metal particles each having a diameter of, for example, about several nm smaller than 10 nm. The dispersant is an organic material containing a volatile component, which is added for evenly diffusing the metal particles and the aggregate in the organometallic paste 6a and is formed as a coating film on surfaces of the metal particles and the aggregate, and a surfactant can be exemplified as a material of the dispersant. The dispersant supporting agent is a blowing agent for exposing surfaces of the metal particles and the aggregate in the organometallic paste 6a, and is an organic material containing a volatile component, which is formed as a coating film on the metal particles and the aggregate and has a function of separating the dispersant from the surfaces of the metal particles and the aggregate by heat reaction in heating to expose the surfaces of the metal particles and the aggregate. The aggregate made of the metal powder such as Ag powder or Cu powder is a metal material whose particle diameter is larger than those of the metal particles made of Ag or Cu which is the main component of the organometallic paste 6a or organometallic column 6. The diameter of the aggregate is about several μm to several ten μm, and the organometallic column 6 is formed of the metal particles filled so that a space between the aggregates is buried. The volatile organic component contained in the organometallic paste 6a as the solvent has a role of adjusting the viscosity of the organometallic paste 6a. However, the volatile organic component may not be contained in the organometallic paste 6a.

Also, in order to further increase liquidity of the organometallic paste 6a and a filling property of the metal particles, liquid resin made of epoxy or biphenyl may be mixed with the organometallic paste 6a. Note that the organometallic paste 6a is made of a material having paste-like liquidity and viscosity at room temperature, and is different from an alloy melted by high temperature to be used, such as solder.

As illustrated in FIG. 1, in a direction along the upper surface of the lower-layer side wiring substrate 10, a lower end of the organometallic column 6 is wider than an upper end thereof, so that the organometallic column 6 has a column-like shape in which a side surface of the organometallic column 6 is tapered. That is, an area of a lower surface of one organometallic column 6 is wider than that of an upper surface thereof, and therefore, an area of the organometallic column 6 contacted with the upper-layer side wiring substrate 20 is smaller than that of the organometallic column 6 contacted with the lower-layer side wiring substrate 10. Also, the height L3 of the organometallic column 6 is higher than that from the upper surface of the lower-layer side wiring substrate 10 to an upper surface of the high-frequency power amplifier chip 2.

The organometallic column 6 is formed by sintering the organometallic paste 6a (see in FIG. 6) made of the fine metal particles whose diameters are about several nm smaller than 10 nm and the aggregate made of the organic dispersant, dispersant supporting agent, volatile organic component, and metal powder. The organometallic paste 6a is a conductive material in which the melting and sintering between the activated metal particles and between the metal particle and the coated connection surface such as the electrode formed on the surface of the lower-layer side wiring substrate 10 or the upper-layer side wiring substrate 20 are advanced by the reaction of the organic dispersant with the dispersant supporting agent by heating to finally form metal bonding between the metal particles. At this time, the aggregate made of the metal powder and the metal particles or the coated connection surface such as the electrode formed on the surface of the lower-layer side wiring substrate 10 or the upper-layer side wiring substrate 20 are adhered to each other and sintered, so that they are bonded by the metal bonding.

Regarding a heating temperature at this time although depending on the components of the organic dispersant and the dispersant supporting agent, when a material reacting at, for example, about 180° C. is used, the lower-layer side wiring substrate 10 and the upper-layer side wiring substrate 20 can be electrically connected with each other at a temperature which is about 40° C. lower than about 220° C. of a melting point of solder made of Sn-3Ag-0.5Cu known as lead-free solder. Therefore, the lower-layer side wiring substrate 10 and the upper-layer side wiring substrate 20 can be electrically connected with each other at a lower temperature than that of the connection method with using the solder ball including the Cu core by using the organometallic paste 6a, so that thermal deformation of the wiring substrate can be suppressed and the burning of the wiring substrate can be prevented. Therefore, a high-reliable semiconductor device can be achieved, and a further-downsized and thinner wiring substrate than that with using the solder ball can be used. Note that metals except for Ag and Cu may be used for the metal particles and metal powder (aggregate) contained in the organometallic paste 6a.

Note that the bonding in the aggregate made of the metal particles and metal powder in the organometallic column 6 is achieved by the metal bonding. However, all metal particles and metal powder are not melted for the bonding. For example, only the surfaces of the metal particles are melted, and the surface of the metal particle is partially adhered with a surface of the adjacent metal particle, so that the adjacent metal particles are bonded with each other by the metal bonding. That is, in the plurality of metal particles and plurality of aggregates in the organometallic column 6, their surfaces are partially adhered to each other for the bonding, and they are combined in porous state, so that the organometallic column 6 is formed, and each metal particle and each aggregate have a non-adhered surface.

Also, a connection method can be considered, in which metal particles each having a diameter of about several μm is used as the metal particles contained in the organometallic paste 6a, and a reducible organic film is coated on outer surfaces of the metal particles, so that the organic film is evaporated in heating to expose essential surfaces of the metal particles, and the metal particles are adhered to each other and sintered, and the metal particle and the coated connection surface such as the substrate electrode or others are adhered to each other and sintered, to finally form the metal bonding. However, the viscosity of the paste may be increased as the particle diameter of the metal particle is larger, and therefore, in this case, a volatile solvent may be mixed and kneaded with the paste to adjust the viscosity so as to be easily handled.

Figure 11:
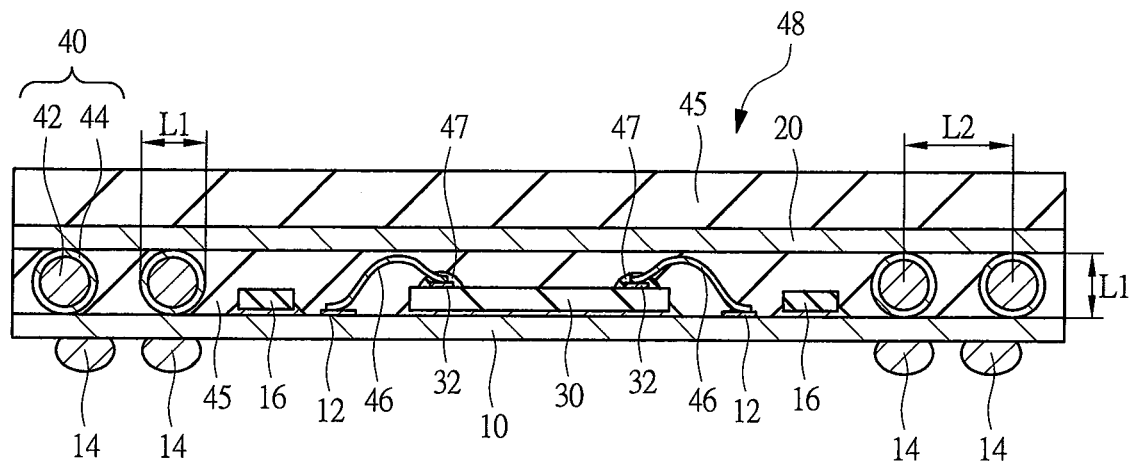
FIG. 11 is a cross-sectional view of a principal part illustrating a conventional semiconductor device.
Figure 12:
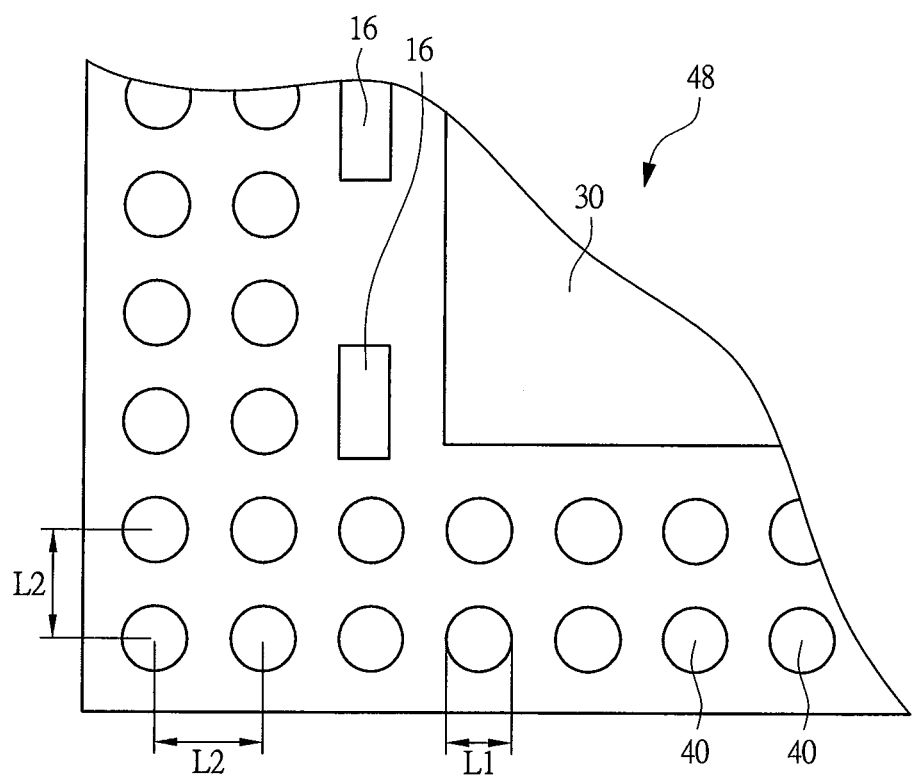
FIG. 12 is a plan view partially illustrating the semiconductor device illustrated in FIG. 11.

Further, in addition to the connecting pitch L4 between the organometallic columns 6, a distance between the other electronic component formed on the same wiring substrate and the organometallic column 6 adjacent to the other electronic component can be also narrower than that of the case in which the lower-layer side wiring substrate 10 and the upper-layer side wiring substrate 20 are connected with each other by the solder ball 40 including the Cu core 42 as illustrated in FIGS. 11 and 12. Similarly, a distance between the organometallic column 6 closest to an end portion of each wiring substrate and the end portion of each wiring substrate can be also narrowed, and therefore, the semiconductor device 1 can be downsized in a direction along the main surface of the lower-layer side wiring substrate 10.

Still further, compared to the connection method with using the solder ball 40 including the Cu core 42 as illustrated in FIGS. 11 and 12, the expensive solder ball 40 is not required for the semiconductor device 1 according to the present embodiment, and a device for arranging the solder ball 40 on the upper surface of the lower-layer side wiring substrate 10 is not also required, and therefore, a manufacturing process becomes simple. Still further, by forming the semiconductor device 1 to be downsized and thinned, the manufacturing cost of the semiconductor device 1 can be reduced.

Note that, instead of the organometallic column 6, the upper surface of the lower-layer side wiring substrate 10 and the lower surface of the upper-layer side wiring substrate 20 may be electrically connected with each other by a conductive paste such as Ag paste, Au paste, or Cu paste. While the conductive paste such as Ag paste is one type of the organometallic paste 6a illustrated in FIG. 6, they are not electrically connected by the metal bonding caused by sintering the metal particles, and they are electrically connected by an adhesive having conductive property. In this manner, even if the conductive paste such as Ag paste is used for the electrical connection between the upper surface of the lower-layer side wiring substrate 10 and the lower surface of the upper-layer side wiring substrate 20, the aim of the present invention is not changed, and therefore, the semiconductor device 1 can be downsized. Also in this case, a high-temperature reflow process for melting and adhering the solder ball 40 illustrated in FIG. 11 is not required, and therefore, the further-downsized and thinner wiring substrate than that of the case of using the solder ball 40 can be used even if the conductive paste is used instead of the organometallic column 6 illustrated in FIG. 1, so that the high-reliable and thinned semiconductor device 1 can be achieved.

The conductive paste is formed by, for example, mixing a plurality of Ag particles with a phenol resin or polyester resin.

After hardening the conductive paste, the Ag particles are electrically connected with each other by not the metal bonding as different from the organometallic column 6 but contact of the Ag particles with each other. And, although the conductive paste is a conductive material having liquidity and viscosity at room temperature, the phenol resin which is the component of the conductive paste or others is hardened in the completed semiconductor device 1 illustrated in FIG. 1, so that it becomes non-liquidity solid.

Also, as illustrated in FIG. 2, the high-frequency power amplifier chip 2 and the circuit component 16 are formed on the lower-layer side wiring substrate 10 having a square plane shape, and the organometallic column 6 is arranged so as to surround the high-frequency power amplifier chip 2, the circuit component 16, and others on the lower-layer side wiring substrate 10. The organometallic column 6 is intermittently formed in two lines along each side of the lower-layer side wiring substrate 10, and a connecting pitch between the adjacent organometallic columns 6 is "L4". Note that the connecting pitch L4 here indicates a distance between centers of the adjacent organometallic columns 6 in the flat square shape.

Hereinafter, a method of manufacturing the semiconductor device 1 according to the embodiment of the present invention is described with reference to FIGS. 3 to 9. FIGS. 3 to 9 are cross-sectional views of a principal part illustrating a state in each step when the semiconductor device 1 is manufactured. Here, since a well-known method can be used as a method of forming wiring patterns of the lower-layer side wiring substrate 10 and the upper-layer side wiring substrate 20, its detailed description is omitted here, and the wiring patterns and electrodes formed on surfaces of the lower-layer side wiring substrate 10 and the upper-layer side wiring substrate 20 are not illustrated.

Figure 3:
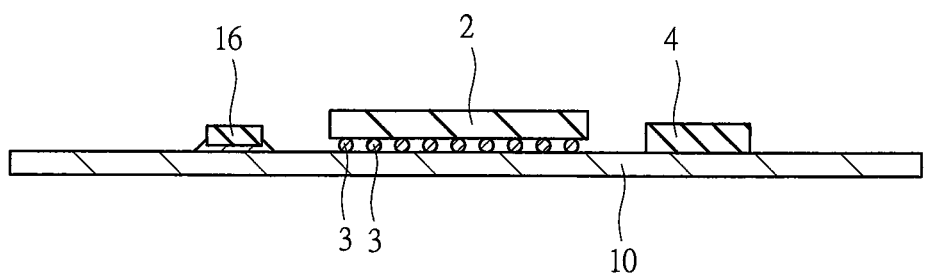
FIG. 3 is a cross-sectional view of a principal part illustrating a method of manufacturing the semiconductor device according to the embodiment of the present invention.

First, as illustrated in FIG. 3, the lower-layer side wiring substrate 10 is prepared, and the high-frequency power amplifier chip 2, the antenna switch 4, and the circuit component 16 are mounted on the upper surface of the lower-layer side wiring substrate 10. A conventional die bonder or component-mounting apparatus may be used for mounting each element. At this time, the high-frequency power amplifier chip 2 is electrically connected with the lower-layer side wiring substrate 10 by the flip-chip bump 3 such as solder, Au bump, or Cu bump. Also, the antenna switch 4 and the circuit component 16 are electrically connected with the lower-layer side wiring substrate 10 through the conductive connecting material such as solder or Ag paste.

Figure 4:
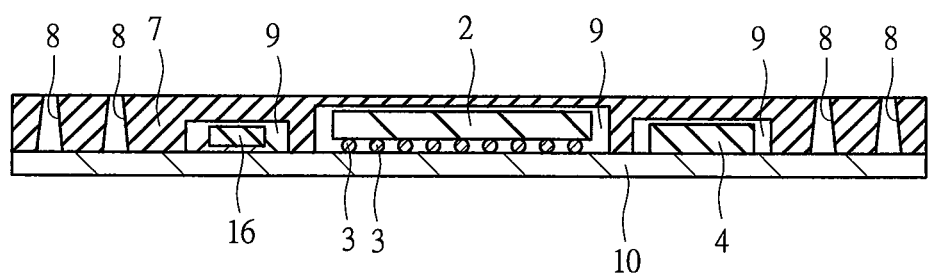
FIG. 4 is a cross-sectional view of the principal part illustrating the method of manufacturing the semiconductor device, continued from FIG. 3.

Next, as illustrated in FIG. 4, a print mask 7 having an opening portion 8 is mounted on the upper surface of the lower-layer side wiring substrate 10. The opening portion 8 is the one penetrating from an upper surface of the print mask 7 to a lower surface thereof. At this time, a position of the opening portion 8 of the print mask 7 is matched with a connecting electrode (not illustrated) with the upper-layer side wiring substrate 20, the electrode being formed on the upper surface of the lower-layer side wiring substrate 10. Also, a pattern is formed with a space 9 so that the print mask 7 does not contact the electronic component already having been mounted on the upper surface of the lower-layer side wiring substrate 10, and therefore, load is not applied to the electronic component even if the print mask 7 is mounted on the lower-layer side wiring substrate 10. In order not to contact the electronic components mounted on the upper surface of the lower-layer side wiring substrate 10 with the upper-layer side wiring substrate 20 mounted on the lower-layer side wiring substrate 10 later, it is required at this time to form a thickness of the print mask 7 larger than heights of these electronic components.

Figure 5:
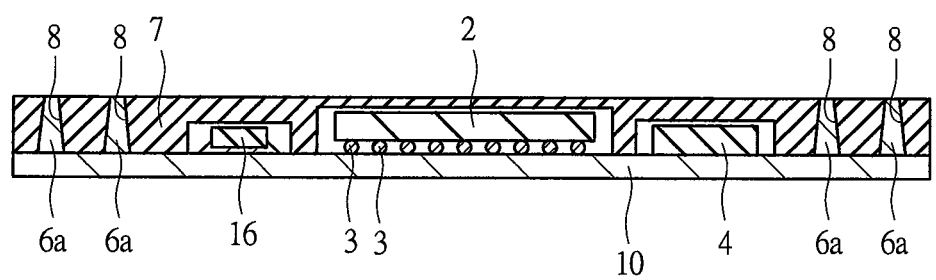
FIG. 5 is a cross-sectional view of the principal part illustrating the method of manufacturing the semiconductor device, continued from FIG. 4.

Next, as illustrated in FIG. 5, the organometallic paste 6a is coated so as to fill the opening portion 8 of the print mask 7, and the organometallic paste 6a is arranged on the main surface of the lower-layer side wiring substrate 10. At this time, when the organometallic paste 6a is supplied, a dispense coating method of coating the organometallic paste 6a filled inside a syringe or other onto a surface of the print mask 7 may be used. Also, in order to fill the organometallic paste 6a inside the opening portion 8 of the print mask without any space, the organometallic paste 6a may be sufficiently filled in the opening portion 8 by using a squeegee (not illustrated) made of urethane rubber, metal, or others so as to go over the upper surface of the print mask 7. Here, the Ag paste may be filled in the opening portion 8 instead of the organometallic paste 6a as described above. Also, as the method of arranging the organometallic paste 6a on the main surface of the lower-layer side wiring substrate 10, a method of supplying the organometallic paste 6a filled inside the syringe or others directly onto the main surface of the lower-layer side wiring substrate 10 without using the print mask 7 by the dispense coating method to form a column-shaped organometallic paste 6a may be used.

Note that the connecting pitch between the organometallic columns 6 illustrated in FIG. 1 can be smaller as an opening diameter of the opening portion 8 is smaller, and therefore, this is advantageous for downsizing the semiconductor device. However, balance with filling property of the organometallic paste 6a illustrated in FIG. 5 is required, and it is also required that the organometallic paste 6a is not collapsed after forming the organometallic paste 6a and removing the print mask 7 from the lower-layer side wiring substrate 10. Therefore, a ratio of about 1 to 5 is desirable for a ratio of the smallest opening diameter of the opening portion 8 to a thickness of the print mask 7. That is, when the thickness of the print mask is 5, a length of 1 or longer is desirable for the opening diameter of the opening portion 8.

Also, the filling property of the organometallic paste 6a is increased as a size of the metal particle forming the organometallic paste 6a is smaller. While the diameter of the metal particle of the organometallic paste 6a is several nm, the diameter of the Ag particle of the Ag paste is several ten nm. Therefore, when the lower-layer side wiring substrate 10 and the upper-layer side wiring substrate 20 are connected with each other by the Ag paste, the filling property inside the opening portion 8 is decreased compared to the case of using the organometallic paste 6a. Therefore, when the lower-layer side wiring substrate 10 and the upper-layer side wiring substrate 20 are connected with each other by the Ag paste, it is required to increase the opening diameter of the opening portion 8 of the print mask 7.

Next, as illustrated in FIG. 6, by removing the print mask 7 from the lower-layer side wiring substrate 10, the column-shaped organometallic paste 6a is formed on the lower-layer side wiring substrate 10. At this time, in order not to collapse the organometallic paste 6a, a taper shape may be provided from an upper surface of the opening portions 8 of the print mask 7 toward a lower surface thereof. That is, the print mask 7 in which an opening diameter of the opening portion 8 on a lower-surface side of the print mask 7 is larger than that on an upper-surface side thereof is used. By providing the taper shape from the upper surface of the opening portion 8 of the print mask 7 toward the lower surface thereof, the print mask 7 is easily removed upward, so that separation of the organometallic paste 6a from the upper surface of the lower-layer side wiring substrate 10 can be prevented.

Note that, without providing the taper shape from the upper surface of the opening portion 8 of the print mask 7 toward the lower surface thereof, when the upper-surface-side opening diameter of the opening portion 8 and the lower-surface-side opening diameter thereof have the same length so that sidewalls of the organometallic paste 6a are formed so as to vertically contact the main surface of the lower-layer side wiring substrate 10, the connecting pitch between the organometallic pastes 6a can be narrower than that of the case of providing the taper shape from the upper-surface-side opening portion 8 of the print mask 7 toward the lower-surface-side opening portion 8 thereof.

Figure 7:
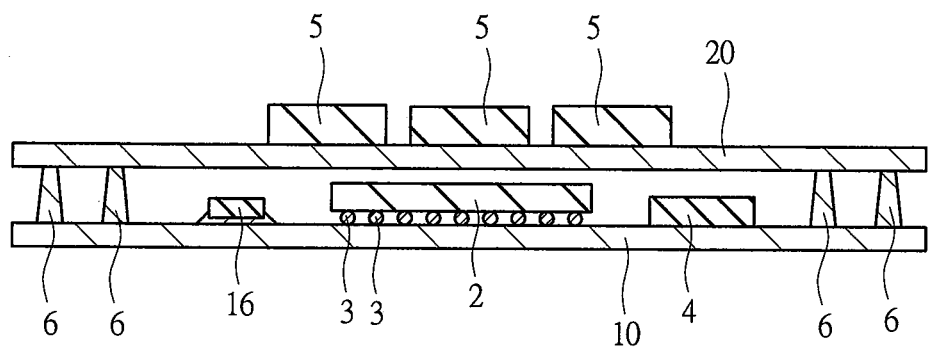
FIG. 7 is a cross-sectional view of the principal part illustrating the method of manufacturing the semiconductor device, continued from FIG. 6.

Next, as illustrated in FIG. 7, the upper-layer side wiring substrate 20 previously mounting the electronic component such as the filter 5 for removing high-frequency noises is stacked on the upper surface of the lower-layer side wiring substrate 10 through the organometallic paste 6a so that a position of the connecting electrode with the lower-layer side wiring substrate 10 is matched with a position of the column-shaped organometallic paste 6a. And then, the metal particles contained in the organometallic paste 6a, and the metal particles and the electrodes on the surfaces of the lower-layer side wiring substrate 10 and the upper-layer side wiring substrate 20 are heated up to the temperature at which they are melted and sintered, so that the organometallic paste 6a is hardened to form the organometallic column 6.

Although the heating temperature at this time depends on volatile components (organic dispersant, dispersant supporting agent, and others) contained in the organometallic paste 6a, the connection can be made at a temperature which is about 40° C. lower than about 220° C. of the melting point of solder as long as the materials react at about 180° C. As a result, the lower-layer side wiring substrate 10 and the upper-layer side wiring substrate 20 are strongly connected with each other by the organometallic column 6 made of the organometallic paste 6a formed by partially melting and bonding the surfaces of the plurality of metal particles forming the organometallic paste 6a. Also, depending on cases, by applying vertical load from the upper surface of the upper-layer side wiring substrate 20 as pressure and heating, the strong connection can be obtained.

Figure 8:
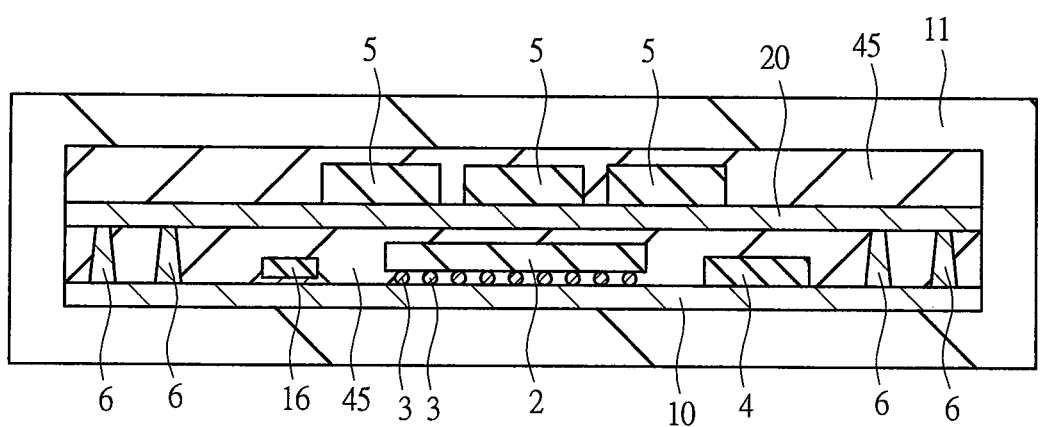
FIG. 8 is a cross-sectional view of the principal part illustrating the method of manufacturing the semiconductor device, continued from FIG. 7.

Next, as illustrated in FIG. 8, the sealing resin 45 is flown into a space between the lower-layer side wiring substrate 10 and the upper-layer side wiring substrate 20 and on the upper-layer side wiring substrate 20 by a conventional transfer molding method with using a mold 11. In this manner, the high-frequency power amplifier chip 2, the flip-chip bump 3, the circuit component 16, the antenna switch 4, the filter 5, and the organometallic column 6 mounted on the lower-layer side wiring substrate 10 and the upper-layer side wiring substrate 20 are sealed. By using, for example, an organic-based resin such as epoxy or biphenyl containing glass silica filler or others as a member of the sealing resin 45 at this time, the filling property of the sealing resin 45 can be increased due to the flowing as using capillarity.

Figure 9:
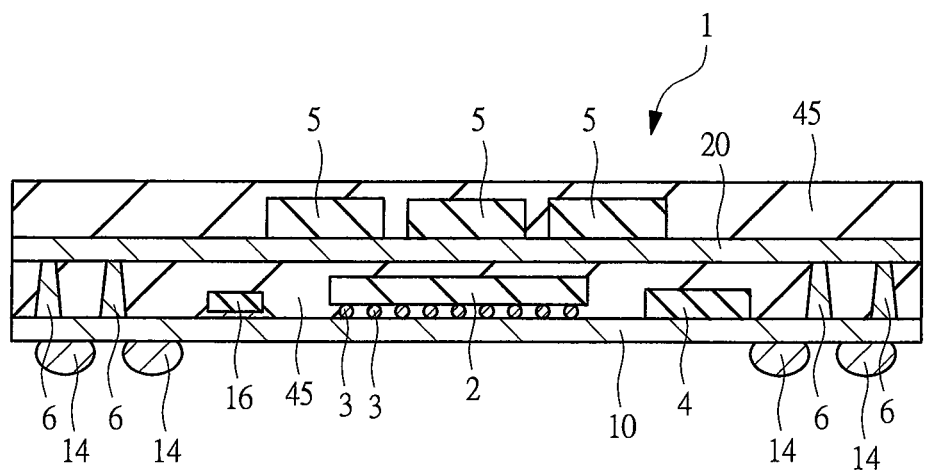
FIG. 9 is a cross-sectional view of the principal part illustrating the method of manufacturing the semiconductor device, continued from FIG. 8.

Next, the semiconductor device is removed from the mold 11, and then, a bump 14 made of solder or others is bonded to an electrode (not illustrated) formed on the lower surface of the lower-layer side wiring substrate 10 as illustrated in FIG. 9, so that the semiconductor device 1 according to the present embodiment is completed.

Here, since the lower-layer side wiring substrate 10 and the upper-layer side wiring substrate 20 are conventionally and electrically connected with each other by the solder ball 40 as illustrated in FIG. 11, the solder ball 40 having the diameter L1 which is the same length as the height required between the lower-layer side wiring substrate 10 and the upper-layer side wiring substrate 20 is used, and the connecting pitch L2 equal to or larger than the diameter L1 is required, and therefore, it is difficult to downsize the semiconductor device 1. That is, when the solder ball 40 is used, if the diameter L1 of the solder ball 40 which is the same length as the height required between the lower-layer side wiring substrate 10 and the upper-layer side wiring substrate 20 is, for example, 400 µm, 400 µm or larger is required for the connecting pitch L2 which is the distance between the centers of the adjacent solder balls 40.

In the present embodiment, as illustrated in FIG. 1, since the lower-layer side wiring substrate 10 and the upper-layer side wiring substrate 20 are electrically connected with each other by the organometallic column 6, the length of the connecting pitch between the organometallic columns 6 can be the connecting pitch L4 smaller than the connecting pitch L2 illustrated in FIG. 11, so that the semiconductor device 1 can be downsized.

Regarding a specific size of the organometallic column 6 illustrated in FIG. 1, since the ratio of the smallest opening diameter of the opening portion 8 on the upper surface of the print mask 7 to the thickness of the print mask 7 can be about 1 to 5, a ratio of the height of the formed organometallic column 6 to a width of the upper surface of the organometallic column 6 becomes also about 1 to 5. The thickness of the print mask 7 is the same as the height L3 which is the distance between the lower-layer side wiring substrate 10 and the upper-layer side wiring substrate 20, and therefore, if the distance between the lower-layer side wiring substrate 10 and the upper-layer side wiring substrate 20 is 400 µm, the width of the organometallic column 6 can be about 100 µm while 400 µm is required for the width of the solder ball 40 in the direction along the upper surface of the lower-layer side wiring substrate 10. Here, the organometallic column 6 has the taper shape whose lower end is wider than its upper end in the direction along the upper surface of the lower-layer side wiring substrate 10. As the width of the organometallic column 6, a width of the lower end can be about 100 µm, and a width of the upper end can be about 80 µm.

In the present embodiment, since the lower-layer side wiring substrate 10 and the upper-layer side wiring substrate 20 are electrically connected with each other by the organometallic column 6, the connecting pitch can be smaller than that of the case using the solder ball 40 including the Cu core 42 illustrated in FIG. 11, and therefore, the semiconductor device in which the wiring substrates are stacked and sealed by the resin can be downsized.

Also, by using the organometallic column 6 as illustrated in FIG. 1, the reflow heating at the high temperature for the connection by the solder ball 40 illustrated in FIG. 11 is not required, and therefore, the thermal deformation of the wiring substrate used in the downsized and thinned semiconductor device can be suppressed, and decrease in the reliability of the semiconductor device can be prevented. Therefore, the stacking structure with using the further-downsized and thinner wiring substrate than that of the case of using the solder ball 40 can be achieved.

Further, the solder ball 40 including the Cu core 42 which is expensive is not used, and an apparatus for arranging the solder ball 40 is also unnecessary, and therefore, a manufacturing cost can be suppressed, and a cheap semiconductor device can be provided.

In the foregoing, the invention made by the inventors has been concretely described based on the embodiments. However, it is needless to say that the present invention is not limited to the foregoing embodiments and various modifications and alterations can be made within the scope of the present invention.

Figure 10:
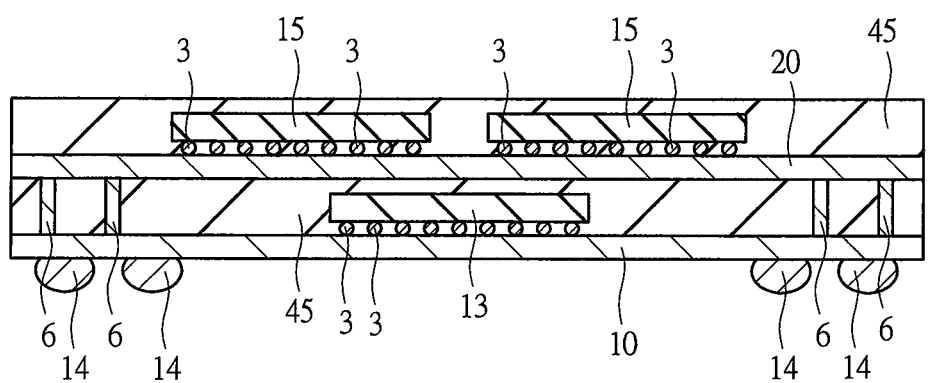
FIG. 10 is a cross-sectional view of a principal part illustrating a semiconductor device according to another embodiment of the present invention.

For example, the present invention is not limited to the high-frequency power amplifier module for communication described in the above-described embodiment, and may be applied to an SiP embedding a microcomputer and a memory as illustrated in FIG. 10 or others. On a semiconductor device 1 illustrated in FIG. 10, a microcomputer chip such as an MCU (memory control unit) and a memory chip such as a DRAM are embedded.

In FIG. 10, a microcomputer chip 13 which is a first semiconductor element is electrically connected with the upper surface of the lower-layer side wiring substrate 10 by the flip-chip bump 3. On the other hand, on the upper surface of the upper-layer side wiring substrate 20, a memory chip 15 is mounted. As the memory chip 15, for example, a DRAM, an SDRAM (synchronous DRAM), or others is used. The memory chip 15 which is a second semiconductor element is electrically connected with a circuit surface (lower surface in FIG. 10) and the upper surface of the upper-layer side wiring substrate 20 by the flip-chip bump 3 as illustrated in FIG. 10. Note that, in FIG. 10, the organometallic column 6 has a cylindrical shape whose side surfaces are not tapered, and the side surfaces of the organometallic column 6 are vertically formed to the upper surface of the lower-layer side wiring substrate 10.

Also, the above-described embodiment has been described with reference to the example of stacking two layers of the wiring substrate mounting the electronic component. However, the stacked wiring substrate may form a plurality of layers more than the two layers.

The present invention relates to a semiconductor device and a method of manufacturing the same. More particularly, the present invention relates to a technique effectively applied to a semiconductor device and a method of manufacturing the same having a three-dimensionally-mounted and electronic-component embedded substrate in which a plurality of wiring substrates each mounting an electronic component are stacked, and the stacked wiring substrates are electrically connected with each other and sealed by resin.

What is claimed is:

1. A method of manufacturing a semiconductor device comprising the steps of:
 (a) providing a first wiring substrate over which a first electronic component is mounted;
 (b) after the step of (a), arranging a conductive paste on the first wiring substrate;
 (c) after the step of (b), stacking a second wiring substrate over which a second electronic component is mounted, over the first wiring substrate using the conductive paste;
 (d) after the step of (c), hardening the conductive paste to form a metal column made of the conductive paste, and electrically connecting between the first wiring substrate and the second wiring substrate through the metal column; and
 (e) after the step of (d), sealing between the first wiring substrate and the second wiring substrate with a resin.

2. The method of manufacturing a semiconductor device according to claim 1, wherein,
 in the step of (b), the conductive paste is arranged on the first wiring substrate by mounting a mask, having an opening, on the first wiring substrate, filling the conductive paste inside the opening, and then, removing the mask from the first wiring substrate.

3. A method of manufacturing a semiconductor device comprising the steps of:
 (a) providing a first wiring substrate having a first front surface, and a first rear surface opposite to the first front surface;
 (b) after the step (a), mounting a first electronic component over the first front surface of the first wiring substrate;
 (c) after the step (b), disposing a mask, having an upper surface, a lower surface opposite to the upper surface, and a plurality of openings penetrating from the upper surface to the lower surface, on the first front surface of the first wiring substrate, and arranging metal paste, including a plurality of metal particles, inside of each of the openings of the mask;
 (d) after the step (c), removing the mask;
 (e) after the step (d), stacking a second wiring substrate, having a second front surface, a second rear surface opposite to the second front surface, and a second electronic component mounted over the second front surface, over the first front surface of the first wiring substrate using pillared metal pastes formed by the steps (c) and (d) such that the second rear surface of the second wiring substrate faces to the first front surface of the first wiring substrate, and such that a plurality of first electrodes formed on the first front surface of the first wiring substrate and the pillared metal pastes are overlapped with a plurality of second electrodes formed on the second rear surface of the second wiring substrate, respectively;
 (f) after the step (e), welding and sintering between the pillared metal pastes and the first and second electrodes by heating the pillared metal pastes, thereby forming a plurality of metal pillars;
 (g) after the step (f), supplying resin between the first wiring substrate and the second wiring substrate, and over the second front surface of the second wiring substrate, thereby sealing the first electronic component, the metal pillars and the second electronic component with the resin; and
 (h) after the step (g), bonding a plurality of bumps on the first rear surface of the first wiring substrate.

4. The method of manufacturing a semiconductor device according to claim 3, wherein each of the openings of the mask has an upper opening portion opened on the upper surface, and a lower opening portion opened on the lower surface;
 wherein an opening size of the lower opening portion is larger than that of the upper opening portion; and
 wherein in the step (c), the mask is disposed over the first front surface of the first wiring substrate such that the lower surface of the mask faces to the first front surface of the first wiring substrate.

5. The method of manufacturing a semiconductor device according to claim 3, wherein the resin used in the step (g) is comprised of a material including epoxy or biphenyl including glass silica filler.

6. The method of manufacturing a semiconductor device according to claim 3, wherein a diameter of each of the metal particles is less than or equal to 10 nm.

7. The method of manufacturing a semiconductor device according to claim 3, wherein the metal paste contains Ag, Cu, or Au.

* * * * *